(12) United States Patent
Ying et al.

(10) Patent No.: US 10,224,348 B2
(45) Date of Patent: Mar. 5, 2019

(54) PIXEL UNIT STRUCTURE AND DISPLAY DEVICE

(71) Applicant: Shenzhen China Star Optoelectronics Technology Co., Ltd., Shenzhen, Guangdong (CN)

(72) Inventors: Jianjian Ying, Guangdong (CN); Peng Du, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 168 days.

(21) Appl. No.: 15/329,365

(22) PCT Filed: Jan. 16, 2017

(86) PCT No.: PCT/CN2017/071240
§ 371 (c)(1),
(2) Date: Jan. 26, 2017

(87) PCT Pub. No.: WO2018/120319
PCT Pub. Date: Jul. 5, 2018

(65) Prior Publication Data
US 2018/0342540 A1 Nov. 29, 2018

(30) Foreign Application Priority Data
Dec. 29, 2016 (CN) .......................... 2016 1 1244006

(51) Int. Cl.
*H01L 27/12* (2006.01)
*H01L 49/02* (2006.01)
*G02F 1/1368* (2006.01)
*G02F 1/1343* (2006.01)
*G02F 1/1333* (2006.01)
*G02F 1/1362* (2006.01)

(52) U.S. Cl.
CPC ........ *H01L 27/1255* (2013.01); *G02F 1/1368* (2013.01); *G02F 1/13439* (2013.01); *G02F 1/133345* (2013.01); *G02F 1/134309* (2013.01); *G02F 1/136213* (2013.01); *G02F 1/136227* (2013.01); *H01L 27/124* (2013.01); *H01L 28/60* (2013.01); *G02F 2001/134318* (2013.01); *G02F 2001/136222* (2013.01); *G02F 2201/124* (2013.01)

(58) Field of Classification Search
CPC .................................................. H01L 27/1255
USPC .......................................................... 257/71
See application file for complete search history.

(56) References Cited

U.S. PATENT DOCUMENTS

2007/0269936 A1* 11/2007 Tanaka ................ G02F 1/13458
438/133
2008/0100762 A1* 5/2008 Onogi ............... G02F 1/134363
349/39
(Continued)

Primary Examiner — Jami Valentine Miller

(57) ABSTRACT

Disclosed are a pixel unit structure and a display device. The pixel unit structure includes a thin film transistor formed on a substrate, and a first insulating layer, a first transparent electrode layer, a second insulating layer, and a second transparent electrode layer formed in sequence from bottom to top above the thin film transistor. A storage capacitor is formed between the first transparent electrode layer and the second transparent electrode layer.

6 Claims, 5 Drawing Sheets

(56) References Cited

U.S. PATENT DOCUMENTS

| | | | | |
|---|---|---|---|---|
| 2012/0169954 A1* | 7/2012 | Liu | ............... | G09G 3/3611 |
| | | | | 349/38 |
| 2012/0182512 A1* | 7/2012 | Sakurai | ............ | G02F 1/133528 |
| | | | | 349/141 |
| 2015/0036090 A1* | 2/2015 | Seo | ............... | G02F 1/136213 |
| | | | | 349/106 |
| 2015/0168799 A1* | 6/2015 | Emori | ............... | G02F 1/167 |
| | | | | 324/750.01 |
| 2016/0223873 A1* | 8/2016 | Shin | ............... | G02F 1/134309 |

* cited by examiner

PIXEL UNIT STRUCTURE AND DISPLAY DEVICE

CROSS-REFERENCE TO RELATED APPLICATIONS

This application claims the priority of Chinese patent application CN 201611244006.9, entitled "Pixel unit structure and display device" and filed on Dec. 29, 2016, the entirety of which is incorporated herein by reference.

FIELD OF THE INVENTION

The present disclosure relates to the technical field of display, and in particular, to a pixel unit structure and a display device.

BACKGROUND OF THE INVENTION

With the development of display technology, LCD (liquid crystal display) devices have become the most common display devices. An LCD has advantages such as high space utilization, low power consumption, no radiation and low electromagnetic interference, and therefore is widely used in communication tools such as televisions, mobile phones, and tablet computers.

At present, one direction of the development of the display technology is high resolution and high PPI (Pixel per Inch). While fine and delicate ultra high definition display is achieved, a corresponding pixel size would be reduced with an increase of resolution and PPI. While the pixel size is reduced, a metal area per unit area would be increased; a corresponding aperture ratio would be reduced; and generally, corresponding transmittance would also be reduced greatly. This has become a bottleneck for a high resolution and high PPI pixel design.

As shown in FIG. 1, a VA (vertical alignment) liquid crystal display device is taken as an example, and a color filter layer is provided on an array substrate, i.e., COA (Color filter On Array) technology is used in a pixel structure. A left side portion in FIG. 1 shows a TFT (Thin Film Transistor) structure, and a right side portion shows a storage capacitor (Cst) structure that is configured to provide a pixel deflection voltage. The storage capacitor is composed of a first metal layer 1 and a second metal layer 2. Capacitance is proportional to an overlapping area of the two metal layers. Since the first metal layer 1 and the second metal layer 2 are optically opaque metals, the aperture ratio is seriously affected. In addition, an optically opaque design is used in an area above a data line for shielding light, and a product with a DBS (Data line BM Less) design is shown in FIG. 2. A transparent common electrode 30 is provided above a data line 20 for shielding light. In consideration of improving transmittance, a distance B between the common electrode 30 and a pixel electrode 40 is usually minimized. Thus, a manufacturing difficulty is increased. An entire optically opaque area above the data line is shown as an area A in FIG. 2 including the common electrode 30, a double 13 area, and overlapping areas of the pixel electrodes 40 with shielding metals 10. As a result, an existing display device has a low aperture ratio, which leads to a technical problem of low transmittance.

SUMMARY OF THE INVENTION

An objective of the present disclosure is to provide a pixel unit structure and a display device, so to solve a technical problem that an existing display device has a low aperture ratio.

The present disclosure provides a pixel unit structure which comprises a thin film transistor formed on a substrate, and a first insulating layer, a first transparent electrode layer, a second insulating layer, and a second transparent electrode layer formed in sequence from bottom to top above the thin film transistor. The first transparent electrode layer and the second transparent electrode layer form a storage capacitor therebetween.

In one embodiment, the first transparent electrode layer is a common electrode and the second transparent electrode layer is a pixel electrode.

Further, the second transparent electrode layer is connected to a drain of the thin film transistor by means of a via hole.

Preferably, the common electrode has a flat plate shape, and the pixel electrode has a comb-teeth shape.

Further, the pixel unit structure further comprises a color filter layer provided between the first insulating layer and the first transparent electrode layer.

In another embodiment, the first transparent electrode layer is a pixel electrode and the second transparent electrode layer is a common electrode.

Further, the first transparent electrode layer is connected to a drain of the thin film transistor by means of a via hole.

Preferably, the common electrode has a comb-teeth shape, and the pixel electrode has a flat plate shape.

Preferably, the pixel unit structure further comprises a third insulating provided between the first transparent electrode layer and the color filter layer.

The present disclosure further provides a display device which comprises a plurality of pixel units, and each pixel unit of the pixel units has an aforesaid pixel unit structure.

The present disclosure has the following beneficial effects. In the pixel unit structure provided by the present disclosure, a first insulating layer, a first transparent electrode layer, a second insulating layer, and a second transparent electrode layer are formed above a thin film transistor, and the first transparent electrode layer and the second transparent electrode layer form a storage capacitor therebetween. In the pixel unit structure provided by the present disclosure, the storage capacitor is formed by two transparent electrode layers, so that an aperture ratio can be significantly increased. Thus, overall transmittance of the display device can be improved.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in detail with reference to the embodiments and the accompanying drawings, whereby it can be fully understood how to solve the technical problem by the technical means according to the present disclosure and achieve the technical effects thereof, and thus the technical solution according to the present disclosure can be implemented. As long as there is no structural conflict, the embodiments of the present application and all the technical features mentioned in all the embodiments may be combined together in any manner, and the technical solutions obtained in this manner all fall within the scope of the present disclosure.

Embodiment 1

Figure 1:
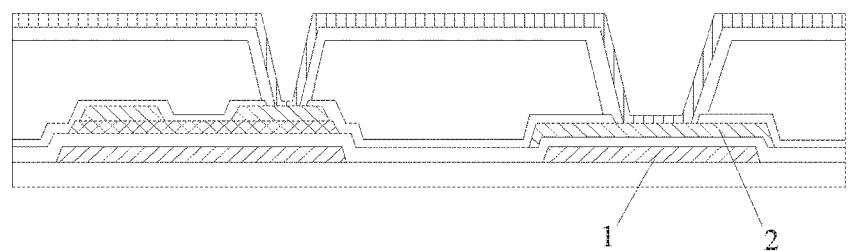
FIG. 1 schematically shows a pixel unit structure in the prior art.
Figure 2:
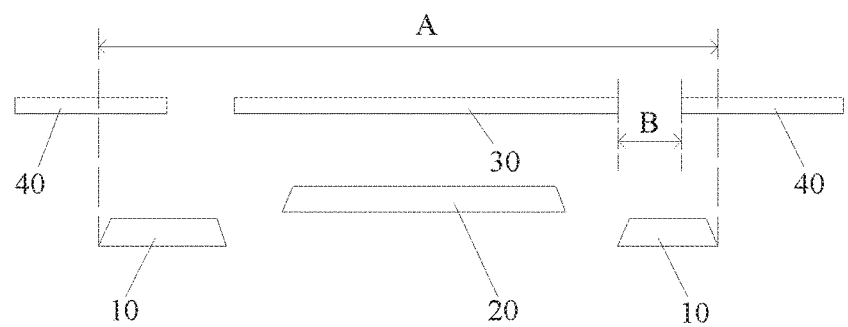
FIG. 2 schematically shows a light shielding area in the pixel unit structure of the prior art.
Figure 3:
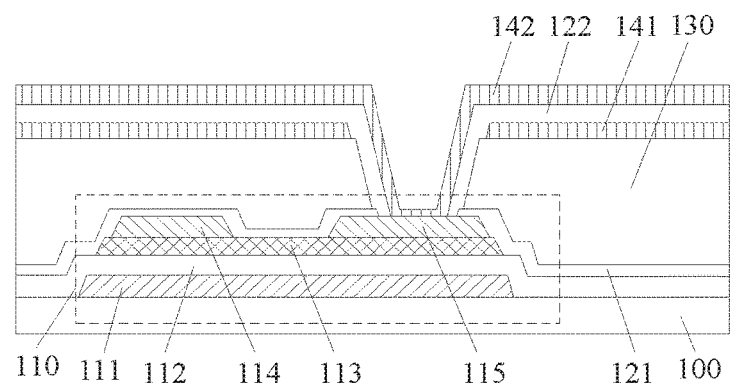
FIG. 3 schematically shows a pixel unit structure according to Embodiment 1 of the present disclosure.

As shown in FIG. 3, the present embodiment provides a pixel unit structure which comprises a thin film transistor 110 formed on a substrate 100, and a first insulating layer 121, a color filter layer 130, a first transparent electrode layer 141, a second insulating layer 122, and a second transparent electrode layer 142 formed in sequence from bottom to top above the thin film transistor. The first transparent electrode layer 141 and the second transparent electrode layer 142 form a storage capacitor therebetween.

In the present embodiment, the thin film transistor 110 is a bottom-gate thin film transistor. The thin film transistor 110 comprises a gate 111 arranged in a first metal layer, a gate insulating layer 112 covering the gate 111, a semiconductor layer 113 formed on the gate insulating layer 112, and a source 114 and a drain 115 formed on the semiconductor layer 113. The source 114 and the drain 115 are arranged in a second metal layer.

In the present embodiment, the first transparent electrode layer 141 is a common electrode, and the second transparent electrode layer 142 is a pixel electrode. The second transparent electrode layer 142 is connected to the drain 115 of the thin film transistor 110 through a via hole.

According to the present embodiment, in the pixel unit structure, the first transparent electrode layer 141 is provided between the color filter layer 130 and the second insulating layer 122 to serve as a common electrode, and the storage capacitor is formed by using two transparent electrode layers, so that an aperture ratio can be significantly increased.

Figure 4:
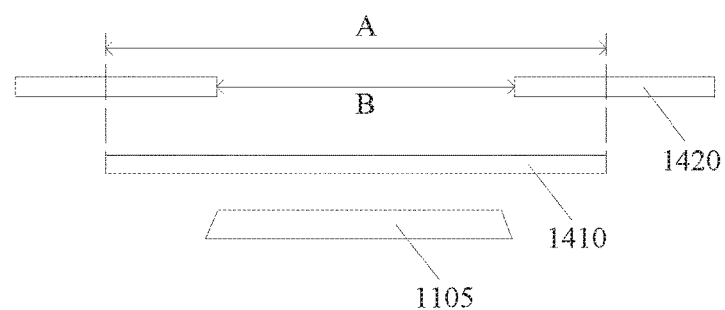
FIG. 4 schematically shows a light shielding area in the pixel unit structure according to Embodiment 1 of the present disclosure.

As shown in FIG. 4, when a DBS design is used, since a pixel electrode 1420 and a common electrode 1410 are arranged in different layers, a distance between two adjacent pixel electrodes can be varied between B and A without affecting the aperture ratio. Thus, a controllable range is widened, and a manufacturing difficulty is also reduced. Meanwhile, an optically opaque area above a data line 1105 is only a width area A of the common electrode 1410, and hence a light shielding area above the data line 1105 is reduced on the basis of ensuring a light shielding effect above the data line 1105. The aperture ratio is thus increased, and thus transmittance is improved.

Moreover, in an existing pixel unit structure, an area of a storage capacitor is generally not large due to a limitation by the aperture ratio. Feed through voltage V of Parasitic Capacitance $Cgs=\Delta V \cdot Cgs/(Cgs+Cst+Clc)$, wherein Clc represents a liquid crystal capacitance, and a value of $Cgs/(Cgs+Cst+Clc)$ is relatively large. Because $\Delta V$ is different in different areas of a panel, corresponding feed through voltage differences are amplified, which results in large differences among voltages of pixel units. Thus, uniformity of the panel is affected.

In the present embodiment, since the storage capacitor is formed of a transparent electrode material, the storage capacitance can be increased as required without considering an influence of transmittance, and the value of $Cgs/(Cgs+Cst+Clc)$ in the feed through voltage can be small. In this way, feed through voltage differences among different areas of the panel are reduced, and thus the uniformity of the panel is improved. Besides, in the present embodiment, the first transparent electrode layer is formed on the color filter layer. Since the first transparent electrode layer has a compact structure and has a protective effect on a color filter, abnormal display caused by diffusing of the color filter into liquid crystals to react with the liquid crystals can be prevented.

Figure 5:
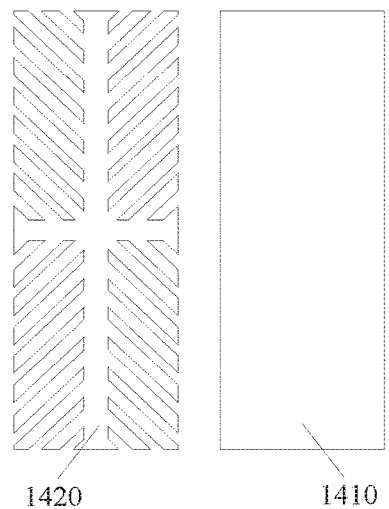
FIG. 5 schematically shows an electrode shape in the pixel unit structure according to Embodiment 1 of the present disclosure.

As shown in FIG. 5, in a preferred embodiment, the common electrode 1410 has a flat plate shape, and the pixel electrode 1420 has a comb-teeth shape A voltage difference between the pixel electrode 1420 and the common electrode 1410 provides a deflection voltage for liquid crystal molecules. As can be seen from FIG. 5, gaps of the pixel electrode 1420 are designed based on four domains, so that the liquid crystal molecules in one pixel unit have four different deflection directions.

Figure 6:
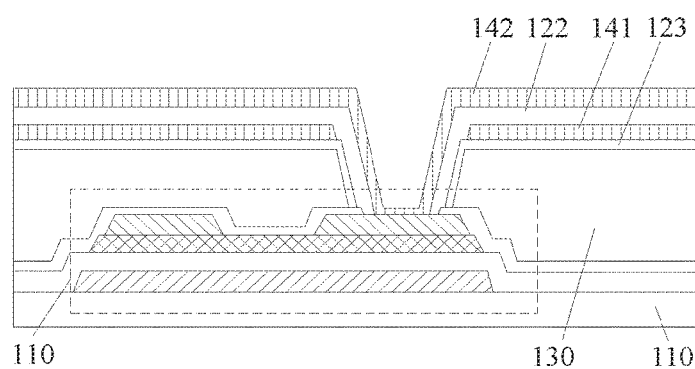
FIG. 6 schematically shows another pixel unit structure according to Embodiment 1 of the present disclosure.

As shown in FIG. 6, in another embodiment, a third insulating layer 123 can be further provided between the first transparent electrode layer 141 and the color filter layer 130. The color filter layer 130 is further protected by the third insulating layer 123.

Embodiment 2

Figure 7:
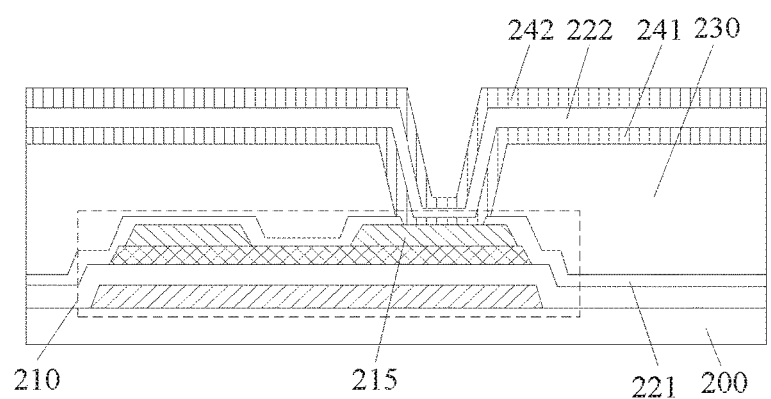
FIG. 7 schematically shows a pixel unit structure according to Embodiment 2 of the present disclosure.

As shown in FIG. 7, the present embodiment provides a pixel unit structure, comprising a thin film transistor 210 formed on a substrate 200, and a first insulating layer 221, a color filter layer 230, a first transparent electrode layer 241, a second insulating layer 222, and a second transparent electrode layer 242 formed in sequence from bottom to top above the thin film transistor. The first transparent electrode layer 241 and the second transparent electrode layer 242 form a storage capacitor therebetween. The thin film transistor 210 is a bottom-gate thin film transistor.

In the present embodiment, the first transparent electrode layer 241 is a pixel electrode, and the second transparent electrode layer 242 is a common electrode. The first transparent electrode layer 241 is connected to a drain 215 of the thin film transistor 210 by means of a via hole.

According to the present embodiment, in the pixel unit structure, the first transparent electrode layer 241 is provided between the color filter layer 230 and the second insulating layer 222 as a pixel electrode, and the storage capacitor is formed by using two transparent electrode layers. In this manner, an aperture ratio can be increased significantly.

Figure 8:
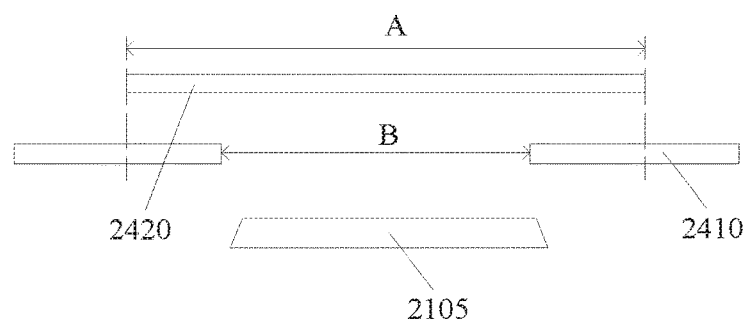
FIG. 8 schematically shows a light shielding area in the pixel unit structure according to Embodiment 2 of the present disclosure.

As shown in FIG. 8, when the DBS design is used, since a pixel electrode 2410 and a common electrode 2420 are arranged in different layers, a distance between two adjacent pixel electrodes can be varied between 13 and A without affecting the aperture ratio. Thus, a controllable range is widened, and a manufacturing difficulty is also reduced. Meanwhile, an optically opaque area above a data line 2105 is only a width area A of the common electrode 2420, and hence a light shielding area above the data line 2105 is reduced on the basis of ensuring a light shielding effect above the data line 2105. The aperture ratio is thus increased, and thus transmittance is improved.

In the present embodiment, since the storage capacitor is formed of a transparent electrode material, the storage capacitance can be increased as required without considering an influence of transmittance, and the value of Cgs/(Cgs+Cst+Clc) in the feed through voltage can be small. In this way, feed through voltage differences among different areas of the panel are reduced, and thus the uniformity of the panel is improved. Besides, in the present embodiment, the first transparent electrode layer is formed on the color filter layer. Since the first transparent electrode layer has a compact structure and has a protective effect on a color filter, abnormal display caused by diffusing of the color filter into liquid crystals to react with the liquid crystals can be prevented.

Figure 9:
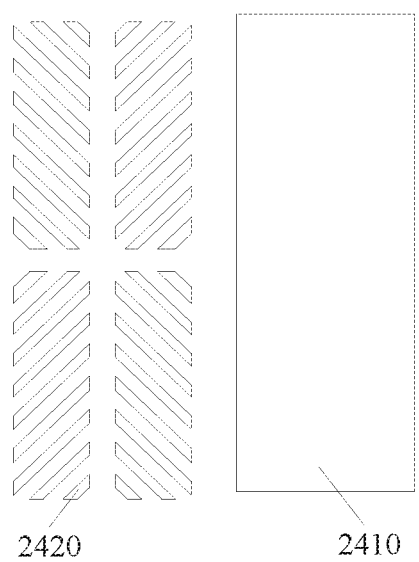
FIG. 9 schematically shows an electrode shape in the pixel unit structure according to Embodiment 2 of the present disclosure.

As shown in FIG. 9, in a preferred embodiment, the common electrode 2420 has a comb-teeth shape, and the pixel electrode 2410 has a flat plate shape. A voltage difference between the pixel electrode 2410 and the common electrode 2420 provides deflection voltages for liquid crystal molecules. As can be seen from FIG. 9, gaps of the common electrode 2420 are designed based on four domains, so that the liquid crystal molecules in one pixel unit have four different deflection directions.

In addition, although the present embodiment and the embodiment 1 are based on the design of four domains, the shape of the common electrode 2420 in the present embodiment is complementary to the shape of the pixel electrode 1420 in the embodiment 1 (shown in FIG. 5). In the present embodiment, the common electrode 2420 has a same potential with an electrode of a color filter substrate, and therefore a potential of an overlapping portion of the pixel electrode 2410 and the common electrode 2420 can be shielded. Thus, an effective portion of a voltage between the pixel electrode 2410 and the electrode of the color filter substrate is the same as what is described in the embodiment 1. Therefore, a same electric field distribution as that of the embodiment 1 can be achieved, and a same display effect also can be achieved.

Embodiment 3

The present disclosure provides a display device, comprising a plurality of pixel units, and each pixel unit has a pixel unit structure provided as described in embodiment 1 or embodiment 2.

As a preferred embodiment, the display device provided in the present embodiment is a VA (Vertical Alignment) liquid crystal display device, and a color filter layer is provided on an array substrate by using COA technology.

The display device provided by the present embodiment has the same technical features as the pixel unit structure provided in the embodiment 1 or embodiment 2. Therefore, the same technical problem can be solved and the same technical effect can be achieved.

It can be understood that the embodiments of the present disclosure illustrate how to improve transmittance based on a COA and DBS structural design of a VA liquid crystal mode, but the COA and DBS structural design are not intended to limit the present disclosure. Non-COA and non-DBS pixel unit structures can also be used to improve transmittance in such a way that two layers of transparent electrode structures form a storage capacitor as provided in the present disclosure.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims

The invention claimed is:

1. A pixel unit structure, comprising a thin film transistor formed on a substrate, and a first insulating layer, a first transparent electrode layer, a second insulating layer, and a second transparent electrode layer formed in sequence from bottom to top above the thin film transistor,
    wherein the first transparent electrode layer and the second transparent electrode layer form a storage capacitor therebetween,
    wherein the first transparent electrode layer is a common electrode and the second transparent electrode layer is a pixel electrode,
    wherein the pixel unit further comprises a color filter layer provided between the first insulating layer and the first transparent electrode layer, and a third insulating layer provided between the first transparent electrode layer and the color filter layer.

2. The pixel unit structure according to claim 1, wherein the second transparent electrode layer is connected to a drain of the thin film transistor by means of a via hole.

3. The pixel unit structure according to claim 1, wherein the common electrode has a flat plate shape, and the pixel electrode has a comb-teeth shape.

4. A display device, comprising a plurality of pixel units, wherein each pixel unit structure of the pixel units comprises a thin film transistor formed on a substrate, and a first insulating layer, a first transparent electrode layer, a second insulating layer, and a second transparent electrode layer formed in sequence from bottom to top above the thin film transistor,
    wherein the first transparent electrode layer and the second transparent electrode layer form a storage capacitor therebetween,
    wherein the first transparent electrode layer is a common electrode and the second transparent electrode layer is a pixel electrode,
    wherein each pixel unit structure of the pixel units further comprises a color filter layer provided between the first insulating layer and the first transparent electrode layer, and a third insulating layer provided between the first transparent electrode layer and the color filter layer.

5. The display device according to claim 4, wherein the second transparent electrode layer is connected to a drain of the thin film transistor by means of a via hole.

6. The display device according to claim 4, wherein the common electrode has a flat plate shape and the pixel electrode has a comb-teeth shape.

* * * * *